(12) United States Patent
Worledge et al.

(10) Patent No.: US 10,839,935 B2
(45) Date of Patent: Nov. 17, 2020

(54) DYNAMIC REDUNDANCY FOR MEMORY

(71) Applicant: International Business Machines Corporation, Armonk, NY (US)

(72) Inventors: Daniel Worledge, San Jose, CA (US); John K. DeBrosse, Colchester, VT (US); Kotb Jabeur, Essex Junction, VT (US); Matthew R. Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/267,727

(22) Filed: Feb. 5, 2019

(65) Prior Publication Data
US 2020/0250029 A1 Aug. 6, 2020

(51) Int. Cl.
*G11C 29/00* (2006.01)
*G11C 29/44* (2006.01)
(Continued)

(52) U.S. Cl.
CPC ........ *G11C 29/838* (2013.01); *G06F 11/1068* (2013.01); *G11C 29/42* (2013.01);
(Continued)

(58) Field of Classification Search
CPC ....... G11C 29/838; G11C 29/44; G11C 29/42; G11C 29/4401
See application file for complete search history.

(56) References Cited

U.S. PATENT DOCUMENTS 5,995,422 A 11/1999 Im et al.
6,065,134 A * 5/2000 Bair .................... G11C 29/4401
714/6.11
(Continued)

FOREIGN PATENT DOCUMENTS

EP 3093763 A1 11/2016

OTHER PUBLICATIONS

Su et al., An Integrated ECC and Redundancy Repair Scheme for Memory Reliability Enhancement, Oct. 3-5, 2005, pp. 1-9, 20th IEEE International Symposium on Defect and Fault Tolerance in VLSI Systems (DFT'05) 0-7695-2464—Aug. 2005.
(Continued)

*Primary Examiner* — Joseph D Torres
(74) *Attorney, Agent, or Firm* — Scully, Scott, Murphy & Presser, PC; Daniel P. Morris, Esq.

(57) ABSTRACT

A dynamic redundancy memory includes a redundancy control module and an ECC module. The ECC detects bit errors, stores the addresses of the error bits, counts the bit errors. If the number of errors exceeds a threshold, the ECC identifies the address as a suspect bit and sends a suspect bit signal to the redundancy control module, which determines whether the suspect bit address is already stored in a redundancy element. If already stored, the element is marked bad, the address of the suspect bit is replaced with a new redundant address and the suspect bit address is stored in a good unused element. The ECC determines whether the error occurrences at the address exceeds a bit error rate threshold. If the error rate threshold is exceeded, the ECC identifies the address as suspect bit and sends the suspect bit signal to the redundancy control module.

25 Claims, 6 Drawing Sheets

(51) Int. Cl.
*G11C 29/42* (2006.01)
*G11C 29/52* (2006.01)
*G06F 11/10* (2006.01)

(52) U.S. Cl.
CPC .......... *G11C 29/44* (2013.01); *G11C 29/4401* (2013.01); *G11C 29/52* (2013.01)

(56) References Cited

U.S. PATENT DOCUMENTS

| | | |
|---|---|---|
| 7,574,648 B2 | 8/2009 | Akiyama et al. |
| 8,069,377 B2 | 11/2011 | Singh |
| 8,091,010 B2 | 1/2012 | Yim |
| 9,229,851 B2 * | 1/2016 | Sukegawa ........... G06F 12/0246 |
| 9,721,639 B1 * | 8/2017 | Calderoni ........... G06F 11/1068 |
| 2009/0148125 A1 * | 6/2009 | Watson .................... H04N 5/76 386/248 |
| 2009/0161466 A1 * | 6/2009 | Hamilton ................ G11C 16/10 365/222 |
| 2009/0292972 A1 * | 11/2009 | Seol ........................ G11C 16/26 714/763 |
| 2010/0135082 A1 * | 6/2010 | Bathul .................... G11C 16/04 365/185.19 |
| 2016/0035417 A1 * | 2/2016 | Park ...................... G11C 13/004 365/148 |
| 2017/0017546 A1 | 1/2017 | Ahmad et al. |
| 2018/0182467 A1 * | 6/2018 | Kang ................. G11C 29/4401 |

OTHER PUBLICATIONS

U.S. Appl. No. 15/630,538, filed Jun. 22, 2017.

\* cited by examiner

DYNAMIC REDUNDANCY FOR MEMORY

BACKGROUND OF THE INVENTION

This disclosure is directed to memories, and more particularly to dynamic redundancy for memories and computer-implemented methods and systems therefor.

Some multi-time-programmable non-volatile memories, for example Spin Torque MRAM, have an intrinsic read-write-error-rate. This means, for example, that every time any bit is written, there is some non-zero probability that it will not write to the correct state. Typically, the error-rate for such errors is engineered to be very low, for example 1e-9 errors/write or less. However, in many applications this is not sufficient, particularly if some bits have worse read-write-error-rates than others. In that case, the bad bits will eventually cause errors in the field.

One way to deal with this is to use error correction code, which can correct some forms of errors. For example, some codes can correct for one error in a word of 72 bits, but not for two errors. However, if there are bad bits with sufficiently high read-write-error-rates, then eventually they will cause an uncorrectable error (for example, two errors in one word).

Another way to deal with this is to use the redundancy technique. Memory arrays are typically manufactured with redundant rows or columns. When failing rows or columns are detected during manufacturing testing, these locations may be permanently disabled and accesses to these cells are instead routed to cells of a redundant row or column. This procedure increases chip yields while maintaining high test coverage.

However, this is often impractical for solving the problem of bad read-write-error-rate bits. For example, it may require writing and reading every bit 1e9 times during burn-in test, which would take too long and thus be too expensive. Often the fuse bit register is formed from a one-time-programmable fuse or antifuse technology, but the register could also be formed using the non-volatile memory (e.g., MRAM) itself, particularly if the nonvolatile memory is sufficiently thermally stable so as to store information during the high temperature chip solder process.

SUMMARY OF THE INVENTION

In one embodiment, a memory system having dynamic redundancy includes a bit cell array, a non-volatile random access memory including a redundancy control module and an error correction code (ECC) module. The redundancy control module has control logic and a plurality of elements, each element of the plurality of elements storing an address of a redundancy bit in the bit cell array.

The ECC module is configured to perform, during operation of the memory system, detecting one or more bits having read-write errors during operation of the memory system, identifying bit cell array addresses of the one or more bits in the bit cell array having the read-write errors, storing the bit cell array addresses of the one or more bits having the read-write errors in an error bit register, and counting the read-write errors detected for each of the bit cell array addresses having the read-write errors stored in the error bit register. ECC module also performs determining whether the number of read-write errors of each of the bit cell array address having the read-write errors exceeds a first threshold, the first threshold being a counted number of read-write errors per bit cell array address the ECC module can correct. In response to determining that the number of read-write errors is above the first threshold, the ECC module performs identifying the bit cell array address in the error bit register having the number of read-write errors above the first threshold as a suspect bit address and sending a suspect bit signal to the redundancy control module identifying the suspect bit address.

The redundancy control module is configured to perform, in response to receiving the signal identifying the suspect bit address, determining whether the suspect bit address is already stored in an element of the redundancy control module. In response to determining that the suspect bit address is already stored in an element in the redundancy control module, the redundancy control module performs marking the element already storing the suspect bit address as bad, replacing the address of the suspect bit with a new address of a redundant bit from the bit cell array and storing the suspect bit address in a unused element of the redundancy control module.

In response to determining that the suspect bit address is not previously stored in an element of the redundancy control module, the redundancy control module performs storing the suspect bit address in an unused element of the redundancy control module and marking the master register of the element storing the suspect bit address as used.

In response to determining that the number of read-write errors is greater than zero and not above the first threshold, the ECC performs determining whether the read-write error occurrences at the bit cell array address exceeds a second threshold, the second threshold being an address bit error rate. In response to determining that the read-write error occurrences at the bit cell array address exceeds the second threshold, the ECC performs identifying the bit cell array address in the error bit register having the number of read-write errors above the second threshold as a suspect bit address and sending a suspect bit signal to the control module identifying the suspect bit address.

A computer implemented method for dynamic redundancy in a memory system also may be provided.

A dynamic redundancy memory device having logic circuitry operable to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION OF PREFERRED EMBODIMENTS

In one embodiment, a memory system including a dynamic redundancy memory is provided. While typical redundancy circuits are programmed during a test phase, such as during at a burn-in test, in one aspect of the present invention, the dynamic redundancy memory can be programmed during the chip operation, as well as during a test phase. In one embodiment, the dynamic redundancy memory communicates with an error correction code (ECC) module to enable the identification of bits with high write-error-rate during regular operation, add them to a redundancy elements module and thus replace them with good bits. The architecture of the memory system is dynamic because it is possible to detect and replace on-the-fly (not only during test) bad bits in the array.

In one embodiment, the bits are considered bad because they present a bit error rate higher than a threshold. The threshold for the bit error rate may be set based on the chip specifications. In this disclosure, the bit error rate is the number of bit errors in a bit cell array address per unit time. The bit error rate can also be the number of bit errors divided by the total number of transferred bits during a predetermined time interval. In one aspect, a register and counter must store the address of wrong bits and the number of errors which occurs at that same address. If the number of error occurrence exceeds the bit error rate threshold, the address is added to the dynamic redundancy memory and replaced by a spare redundant memory.

In another embodiment, the bits are considered bad because they exceed a threshold of the number of errors. The threshold can also be set at the maximum number of errors the ECC module can handle for an address. The threshold may also be set by the user to any number of errors less than the maximum number the ECC can handle. The number of allowed errors before replacing the array address by another address from the redundancy memory can be set depending on the requirements for the chip. In one aspect, the ECC module stores the threshold of the number of errors allowed in word in a register and increments a counter. If the threshold is exceeded, a signal is sent to the redundancy memory to dynamically store the corresponding address and replace it.

In one embodiment, in either case of the threshold being bit error rate or the number of errors, even if the ECC can handle the error, the dynamic redundancy memory and system can replace the word address by another one in the redundancy memory. In one aspect, when the ECC detects that an address has a high bit error rate by combining hard and soft errors, the address with high bit error rate will be replaced even if it is still possible to correct. In some cases, for example, the failures may be "soft" failures in that a cell may sporadically return error data when read, but then function properly for the remainder of its life. "Hard" failures in which a cell permanently loses the ability to retain data are typically due to physical mechanisms occurring over time, often at the site of a physical defect or contaminant at the particular cell.

Figure 1:
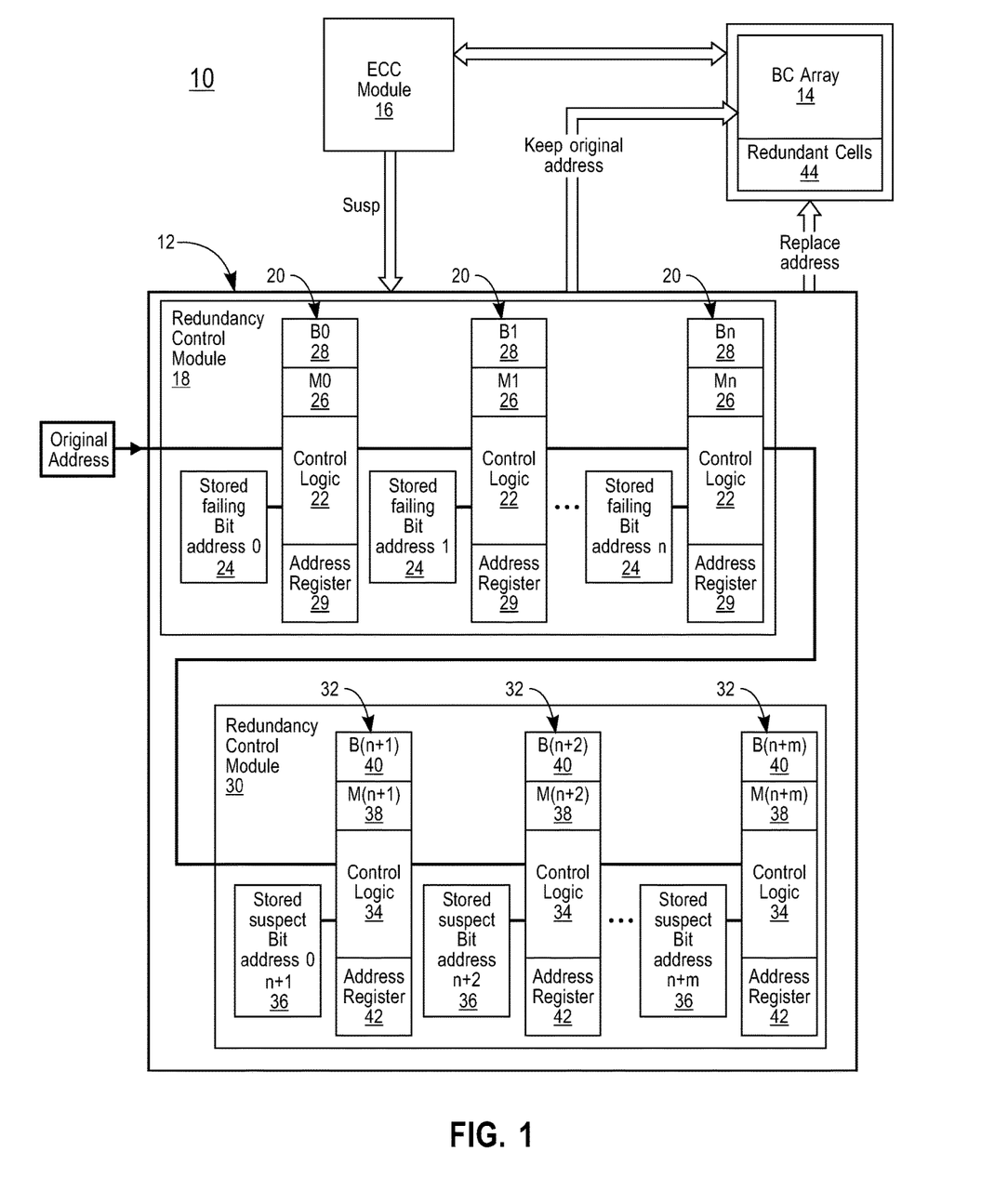
FIG. 1 is a block diagram of one embodiment of the memory system disclosed in this specification.

FIG. 1 is a block diagram of one embodiment of a memory system with dynamic redundancy. The memory system 10 includes a memory 12, a bit cell array 14 and an ECC module 16. in one embodiment, memory 12 is a non-volatile random access memory. In aspect the entirety of memory system 10 may be incorporated in memory 106 or in another aspect partially implemented in memory 106 and processors 100, of the computer system shown in FIG. 6, to be described later.

Memory 12 includes redundancy control module 18 which consists of a plurality of elements 20, each having control logic 22 and registers 24 for storing the addresses of failing bits during the testing of the memory system 10. The elements 20 also contain a master register 26 which indicates if the element is used (1) or not (0) and a bad register 28 which indicates if the element is bad (1) or not (0). The addresses of the redundancy bits to replace a failing bit are stored in the programmed address register 29.

The address of failing bits determined during the test phase are stored in the registers 24. Each address is stored in one element 20. In one embodiment, the element registers 24, 26 and 28 are made of a non-volatile technology that are sufficiently thermally stable so as to store information during the high temperature chip solder process. Typically the addresses are stored in a fuse memory during test then loaded in the elements when the chip starts-up. Typically failing bits are failing for reasons other than high write-error-rate, for example being electrically shorted or open.

Memory 12 also includes redundancy control module 30 which consists of a plurality of elements 32, each having control logic 34 and registers 36 for storing the addresses of failing bits during operation of the memory system. The elements 30 also contain a master register 38 which indicates if the element is used (1) or not (0) and a bad register 40 which indicates if the element is bad (1) or not (0). The addresses of the redundancy bits to replace a failing bit are stored in the programmed address register 42.

During the testing phase, the redundancy control module 18 is operational. The redundant cells 44 are tested and if a cell is good, then control logic 22 writes a '0' in the bad register 28 or else writes a '1' if the cell is good. The cells of BC array 14 are tested and if the tested bit cell is a failure then the control logic 22 writes the failed address in an element 20 and sets to '1' the master register 26 of each written element 20 to mark it as used.

Figure 2:
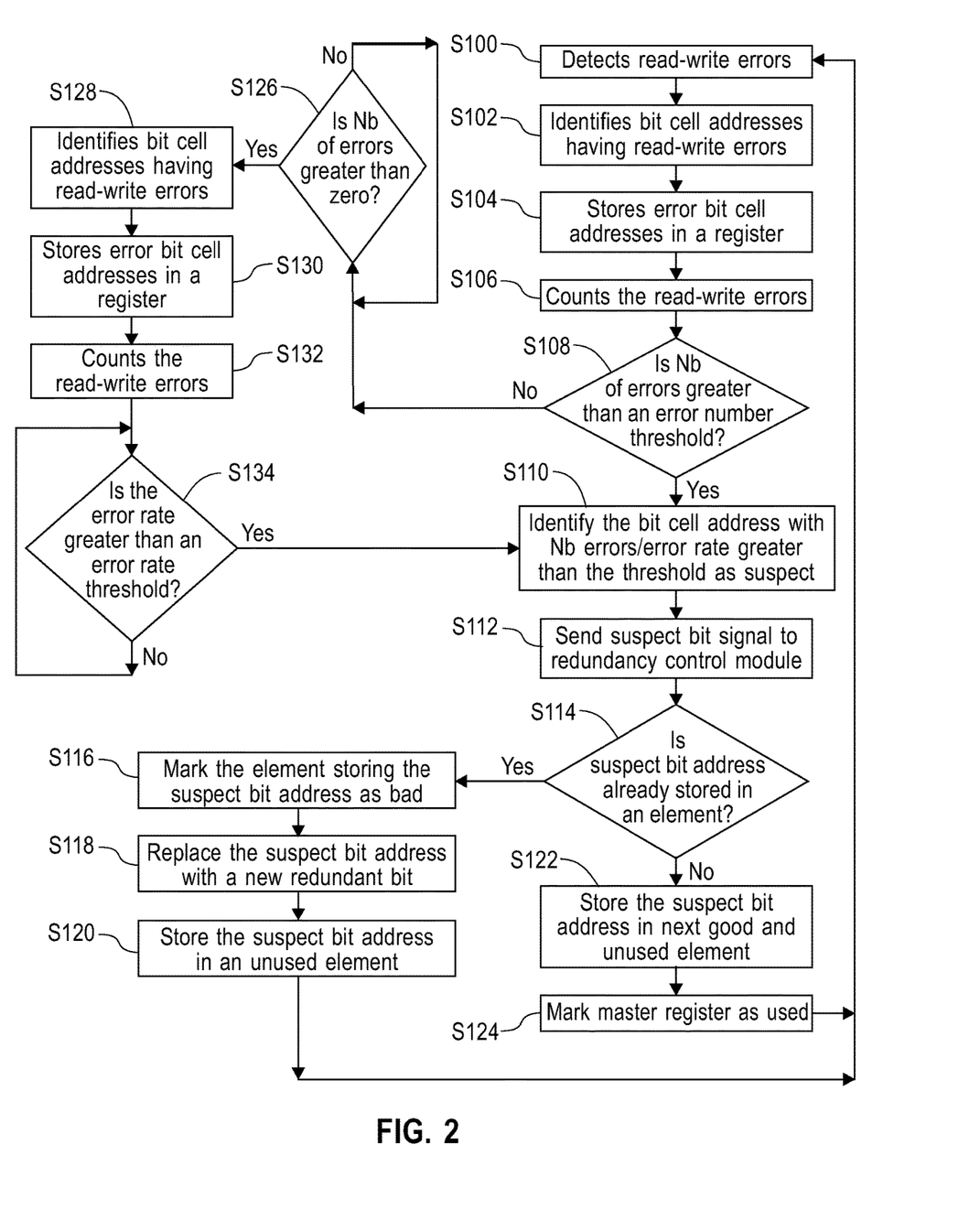
FIG. 2 is a flow diagram of one embodiment of the method disclosed in this specification.

FIG. 2 is a flow diagram of one embodiment of the method of dynamic redundancy in a memory system during the functional operation of the chip. In step S100, the ECC module 16 detecting one or more bits having read-write errors during operation of the memory device. In step S102, the ECC module identifies bit cell array addresses of the one or more bits in the bit cell array having the read-write errors. In step S104, the ECC module stores the bit cell array addresses of the one or more bits having the read-write errors in an error bit register. In step S106, the ECC module counts the read-write errors detected for each of the bit cell array addresses having the read-write errors stored in the error bit register.

In step S108, the ECC module determines whether the number of read-write errors of each of the bit cell array addresses having the read-write errors exceeds a first threshold. In one embodiment, the first threshold is a counted number of read-write errors per bit cell array address the ECC module can correct. The threshold value may be programmed by the user to meet product specifications. If the number of errors stored for a given cell address exceeds the first threshold value, YES in step S108, in step S110 this bit cell is identified as suspect and must be replaced by a redundant cell. In step S112 a signal SUSP is sent to the redundancy control module 30 to store the address of this bit cell in one element 32.

In step S114, the control logic 34 determines if the address is already stored in an element 32 of the redundancy control module 30. If so, YES in step S114, in step S116, this element 32 is marked as bad by writing its bad register 40 to '1' so it will not be used anymore. In step S118, control logic 34 replaces the address of the suspect bit with a new address of a redundant bit from the bit cell array 14 and in step S120 stores the suspect bit address in register 42 in a good and unused element 32 of the redundancy control module 30. The method then returns to step S100 to repeat the process for the next address with a read-write error.

In response to determining that the suspect bit address is not previously stored in an element of the redundancy control module, NO in step S114, in step S122, the control logic 34 keeps the original address and stores the suspect bit address in a good and unused element 32 of the redundancy control module 30 and in step S124 marks the master register 38 of the element 32 storing the suspect bit address as used.

In response to determining that the number of read-write errors is not above the first threshold, NO in step S108, the ECC module determines in step S126 whether the number of read-write errors is greater than zero. In response to determining that the number of read-write errors is not above the first threshold, NO in step S108 and greater than zero, YES in step S126, the ECC module determines in step S128, the ECC module identifies bit cell array addresses of the one or more bits in the bit cell array having the read-write errors. In step S130, the ECC module stores the bit cell array addresses of the one or more bits having the read-write errors in an error bit register. In step S132, the ECC module counts the read-write errors detected for each of the bit cell array addresses having the read-write errors stored in the error bit register.

In step S134, the ECC module determines whether the read-write error occurrences at the bit cell array address exceeds a second threshold. The second threshold being an address bit error rate. In response to the rate of read-write error occurrences at the bit cell array address exceeding the second threshold, YES at step S134, the proceeds to perform steps S110 to S124 as described above.

At least three aspects of the dynamic redundancy memory system, method and memory of the present invention provide an improvement as compared to the architecture of currently known redundancy memory circuitry. In one aspect, the error correction code (ECC) module does not only detect the error and correct it but it also stores the address of the erroneous bit cell. This address is stored in a register. If the number of errors exceeds a certain threshold, a signal is sent to the redundancy control module to write this address in one element and so replace it with a new programmed address which corresponds to a good element in the redundant cells in the bit cell array. The threshold value can be programmed by the user, depending on the bit error rate that he desires from the chip. In a second aspect, the redundancy control module must contain extra unused elements that were not filled during test, so they can be dynamically filled. In a third aspect, the element itself contains an extra register called bad. This register indicates if the redundant cell in the memory array which corresponds to the programmed address is good or bad. While the primary value of this register is filled during test, it can be updated to bad during the operation of the chip, if the ECC module discovers that it has a high bit error rate.

Dynamically adding new faulty addresses in the redundancy memory needs a modification of the redundancy elements architecture to fill the unused element with the new wrong address and to not use the bad memory bit cells in the redundancy memory itself.

where we partially fill the redundancy during test and during the chip lifetime through ECC.

Figure 3:
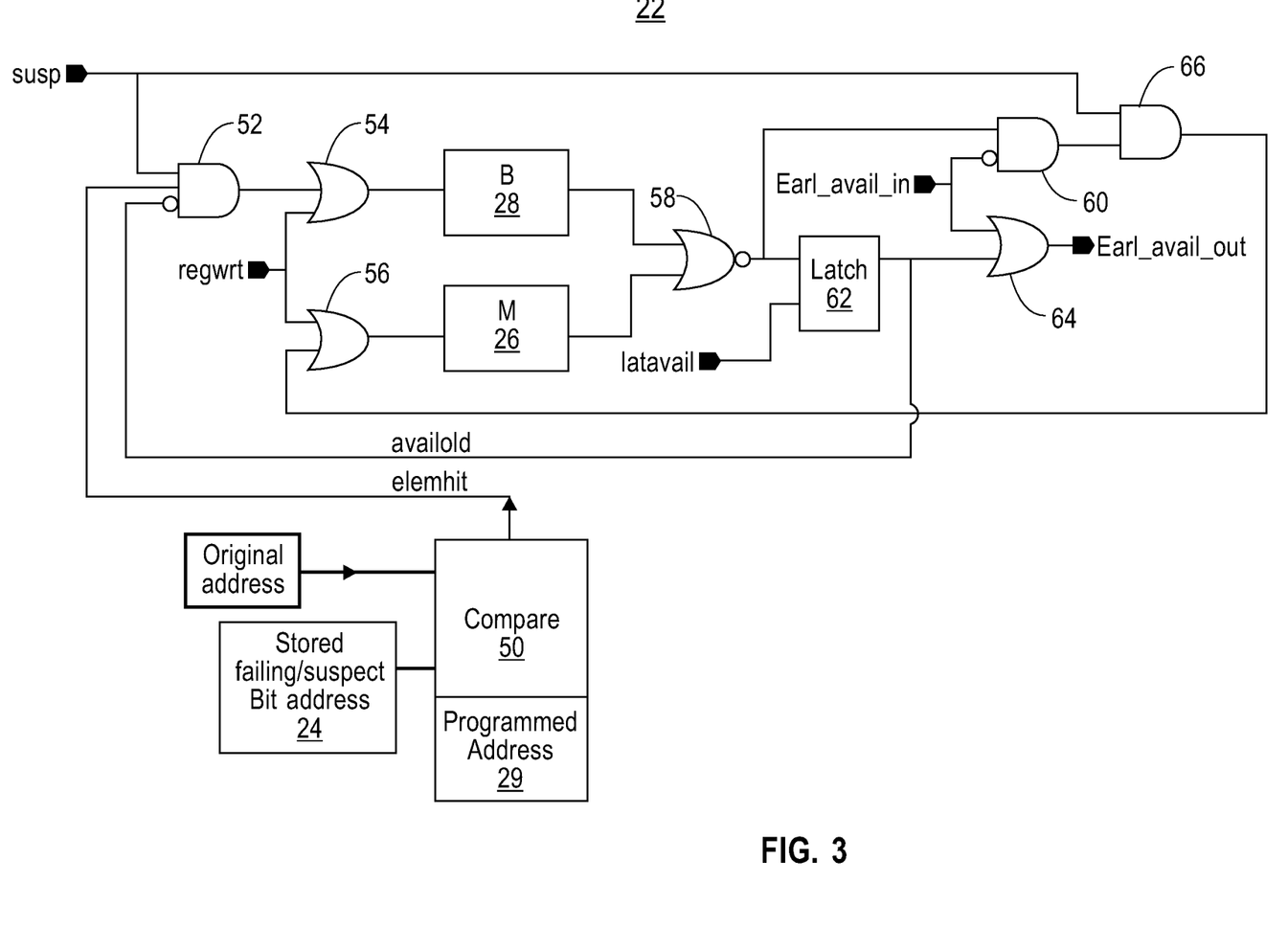
FIG. 3 is logical circuit diagram of one embodiment of the redundancy control module disclosed in this specification.

FIG. 3 is one embodiment of the architecture of control logic 22 of elements 32 for dynamically adding new faulty addresses in the redundancy memory during the chip operation using ECC. The control logic circuit 22 includes comparator 50, providing one input to AND gate 52. The SUSP signal from ECC 16 is a second input to AND gate 52. The SUSP signal generated by the ECC module to mark as bad the element if it has a high error rate or has a high number of errors. The signal availold is an inverse input to AND gate 52. The availold signal insures that only the element containing the address of the high error rate bit is marked as bad and not the next unused available element.

The output of AND gate 52 is one input of OR gate 54. The signal regwrt is a second input to OR gate 54. The signal regwrt writes the address of the failing bit cells detected during test, loaded from a non volatile memory. Furthermore, the signal regwrt is correlated with SUSP signal to write on-the-fly the value of registers 28 and 26 to mark them as bad and/or used, respectively. The signal regwrt is also one input to OR gate 56. The output of OR gate 54 is input to bad register 28 and the output of OR gate 56 is input to master register 26. The outputs of bad register 28 and master register 26 are input to NOR gate 58. Nor gate 58 outputs avail signal which is one input to AND gate 60. The output of NOR gate 58 is also input to latch 62. The Latavail signal is input to latch 62. The latavail signal latches the availability state of the element before writing inside it by the SUSP signal. An element is available when it is not BAD (B=0) and it is not used (M=0).

The Earl_avail_in signal is an inverse input to AND gate 60. The Earl_avail_in signal is also input to OR gate 64, as is the output of latch 62. The output of AND gate 60 is input to AND gate 66, as is the SUSP signal. The output of AND gate 66 is feed back as an input to OR gate 56.

The logic circuit 22 of FIG. 3 performs the steps S114 through S124 of FIG. 2.

Figure 4:
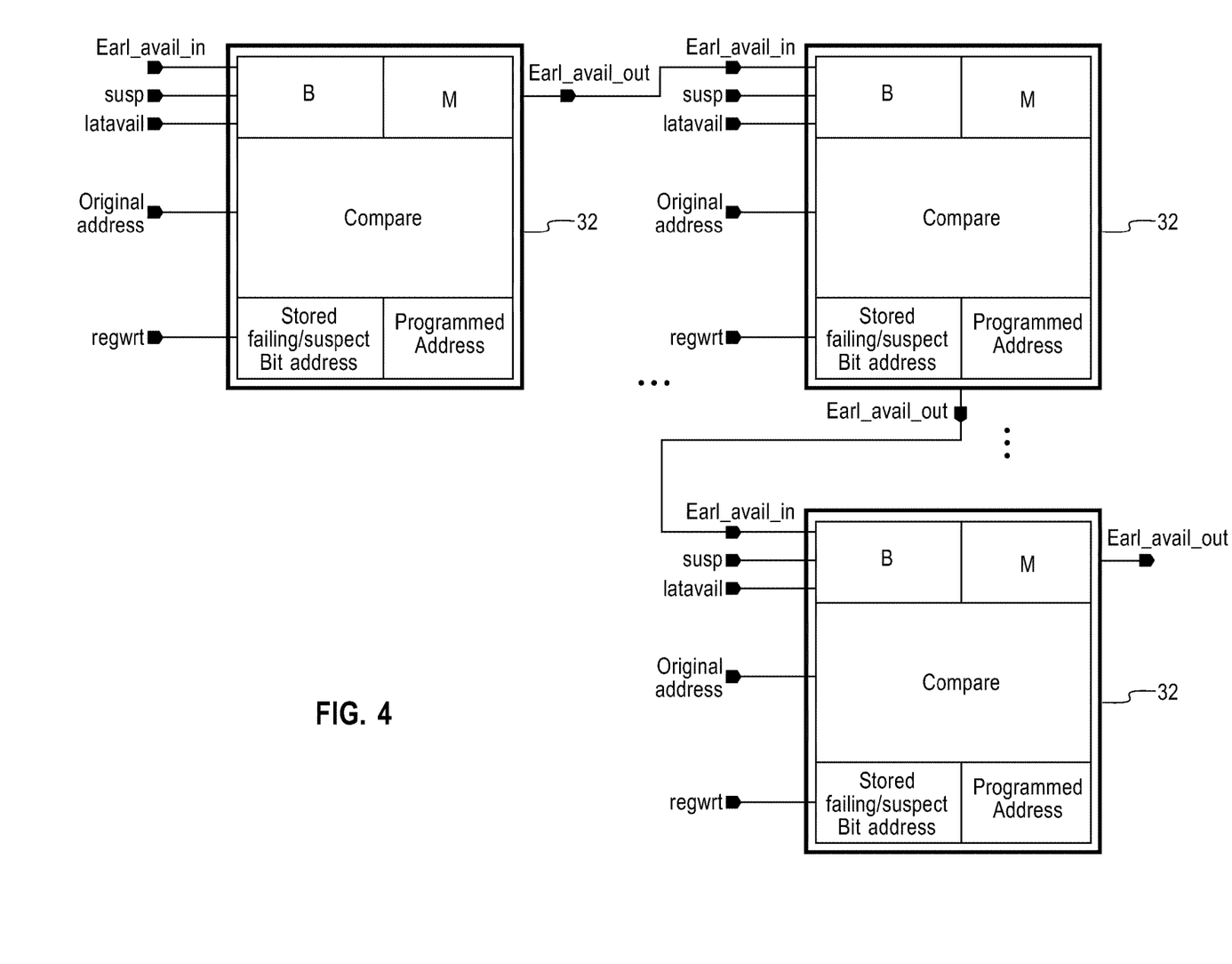
FIG. 4 is a block diagram showing how the redundancy elements are connected together in one embodiment of the redundancy control module disclosed in this specification.

FIG. 4 shows how the elements 32 are connected together within redundancy control module 30. To insure the filling of the whole element block, the elements are correlated between each other by the two signals Earl_avail_in and Earl_avail_out. Thus, the suspect bit address is always stored in the next, good, unused element.

Figure 5:
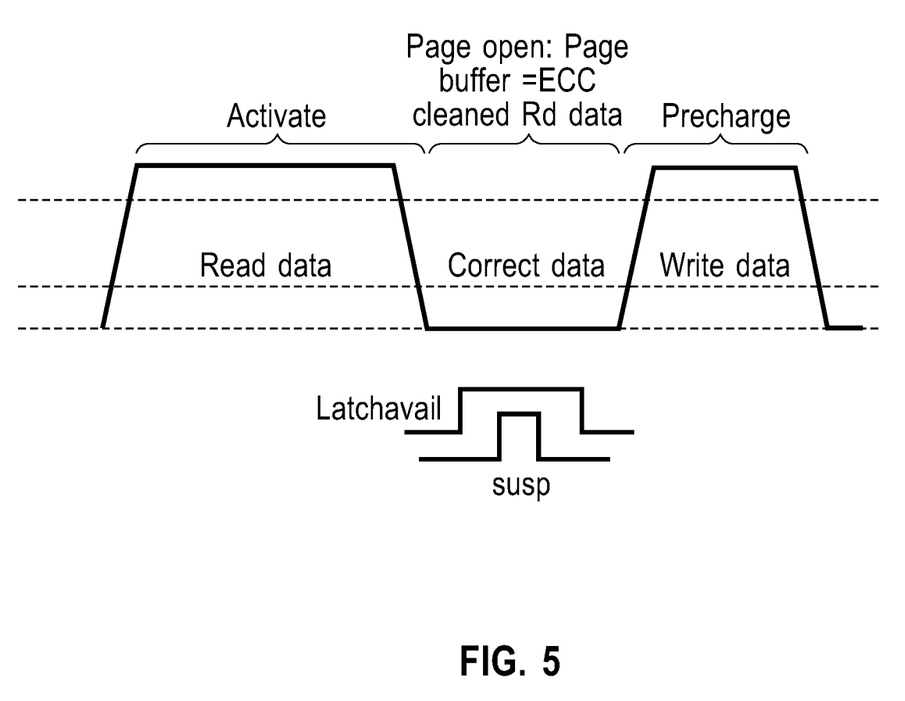
FIG. 5 is a timing sequence in one embodiment of the memory system disclosed in this specification.

Typically the sequence of a RAM operation can be described as in FIG. 5. Typically, it is a sequence of three phases; phase 1 (read data), phase 2 (correct data) and phase 3 (write data). The dynamic update of the redundancy elements occurs during the data correction phase when the ECC block is operating.

The update of the redundancy elements is performed by the two signals 'latavail' and 'susp'. These two signals are activated during the data correction phase. The 'susp' signal is generated by the ECC and must be included inside the 'Latavail' signal to insure the correct sequence of steps S114 through S124 of FIG. 2. Thus, during the write data phase, the corrected data is written in the new address of the redundancy.

Figure 6:
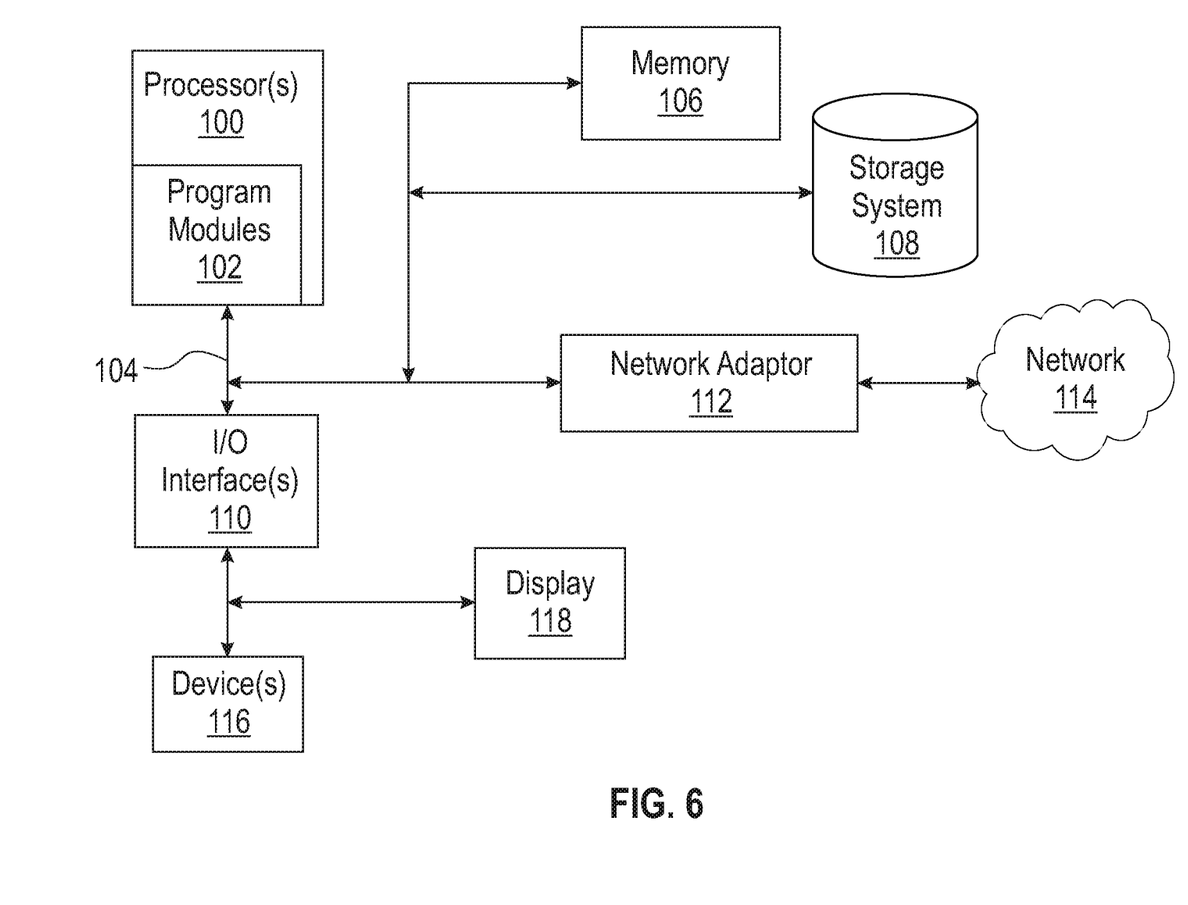
FIG. 6 is a block diagram of an exemplary computing system suitable for implementation of the embodiments of the invention disclosed in this specification.

FIG. 6 illustrates a schematic of an example computer or processing system that may implement the dynamic redundancy memory system, method and/or memory device in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 6 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 100, a system memory 106, and a bus 104 that couples various system components including system memory 106 to processor 100. The processor 100 may include a program module 102 that performs the methods described herein. The module 102 may be programmed into the integrated circuits of the processor 100, or loaded from memory 106, storage device 108, or network 114 or combinations thereof.

In the embodiment of FIG. 6, the memory 106 may include the entirety of the memory system 10 of FIG. 1 and also perform the entirety of the steps of the flow chart of FIG. 2. In one embodiment, the memory 106 includes redundancy control modules 18 and 30 and the bit cell array 14 and the processor 100 may include the ECC module 16.

ECC module 16 may be constructed as conventional logic (e.g., programmable logic, semi-custom or custom logic circuitry) capable of encoding data words into symbols and of decoding symbols into data words, according to the applicable ECC code. ECC module 16 may be integrally implemented within the architecture of memory 106, or alternatively may be realized and carried out by logic circuitry elsewhere in the integrated circuit, including by a processor or logic circuitry in a larger scale integrated circuit of processor 100. It is contemplated that those skilled in the art having reference to this specification will be readily able to realize ECC 16 as appropriate for particular implementations, without undue experimentation.

Bus 104 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 106 can include computer system readable media in the form of volatile memory, such as random access memory (RAM) and/or cache memory or others. Computer system may further include other removable/non-removable, volatile/non-volatile computer system storage media. By way of example only, storage system 108 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

Computer system may also communicate with one or more external devices 116 such as a keyboard, a pointing device, a display 118, etc.; one or more devices that enable a user to interact with computer system; and/or any devices (e.g., network card, modem, etc.) that enable computer system to communicate with one or more other computing devices. Such communication can occur via Input/Output (I/O) interfaces 110.

Still yet, computer system can communicate with one or more networks 114 such as a local area network (LAN), a general wide area network (WAN), and/or a public network (e.g., the Internet) via network adapter 112. As depicted, network adapter 112 communicates with the other components of computer system via bus 104. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a non-transitory computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

In addition, while preferred embodiments of the present invention have been described using specific terms, such description is for illustrative purposes only, and it is to be understood that changes and variations may be made without departing from the spirit or scope of the following claims.

What is claimed is:

1. A memory system comprising:
a bit cell array;
a non-volatile random access memory including a redundancy control module having control logic and a plurality of elements, each element of the redundancy control module having a master register, a suspect bit address register, an error bit address register and a redundancy bit register; and
an error correction code (ECC) module configured to perform during operation of the memory system:

storing the bit cell array addresses of the one or more bits having the read-write errors in the error bit register;
determining whether the number of read-write errors of each of the bit cell array address having the read-write errors exceeds a first threshold and
in response to determining that the number of read-write errors is above the first threshold:
identifying the bit cell array address in the error bit register having the number of read-write errors above the first threshold as a suspect bit address; and
sending a suspect bit signal to the redundancy control module identifying the suspect bit address;
wherein, the control logic of the redundancy control module is configured to:
in response to receiving the signal identifying the suspect bit address, determining whether the suspect bit address is already stored in an element of the redundancy control module; and
in response to determining that the suspect bit address is already stored in an element in the redundancy control module:
marking the element already storing the suspect bit address as bad;
replacing the address of the suspect bit with a new address of a redundant bit from the bit cell array; and
storing the suspect bit address in an unused element of the redundancy control module.

2. The memory system of claim 1, wherein the first threshold is a counted number of read write errors per bit cell array address.

3. The memory system of claim 2, wherein the suspect bit address is stored in the suspect bit register of the unused element of the redundancy control module and in response to the suspect bit address being stored, the control logic of the redundancy control module further performs marking the master register of the element storing the suspect bit address as used.

4. The memory system of claim 3, wherein the new address of the redundant bit is stored in a new address register of the element marked used.

5. The memory system of claim 2, wherein the control logic of the redundancy control module is further configured to perform in response to determining that the suspect bit address is not previously stored in an element of the redundancy control module, storing the suspect bit address in an unused element of the redundancy control module and marking the master register of the element storing the suspect bit address as used.

6. The memory system of claim 1, wherein the ECC module is further configured to perform:
in response to determining that the number of read-write errors is greater than zero and not above the first threshold:
determining whether the read-write error occurrences at the bit cell array address exceeds a second threshold, the second threshold being an address bit error rate; and
in response to determining that the read-write error occurrences at the bit cell array address exceeds the second threshold;
identifying the bit cell array address in the error bit register having the number of read-write errors above the second threshold as a suspect bit address; and
sending a suspect bit signal to the control module identifying the suspect bit address;
wherein, the control logic of the redundancy control module is configured to:
in response to receiving the signal identifying the suspect bit address:
determining whether the suspect bit address is already stored in an element of the redundancy control module; and
in response to determining that the suspect bit address is already stored in an element in the redundancy control module:
marking the element already storing the suspect bit address as bad;
replacing the address of the suspect bit with a new address of a redundant bit from the bit cell array; and
storing the suspect bit address in a unused element of the redundancy control module.

7. The memory system of claim 6, wherein each element of the redundancy control module comprises a master register, a comparator, a new address register and a suspect bit address register.

8. The memory system of claim 7, wherein the suspect bit address is stored in the suspect bit register of the unused element of the redundancy control module and in response to the suspect bit address being stored, the control logic of the redundancy control module further performs marking the master register of the element storing the suspect bit address as used.

9. The memory system of claim 8, wherein the new address of the redundant bit is stored in the new address register of the element marked used.

10. The memory system of claim 7, wherein the control logic of the redundancy control module is further configured to perform in response to determining that the suspect bit address is not previously stored in an element of the redundancy control module, storing the suspect bit address in an unused element of the redundancy control module and marking the master register of the element storing the suspect bit address as used.

11. The memory system of claim 1,
wherein the ECC is further configured to perform during operation of the memory system:
detecting one or more bits having read-write errors during operation of the memory system;
identifying bit cell array addresses of the one or more bits in the bit cell array having the read-write errors;
counting the read-write errors detected for each of the bit cell array addresses having the read-write errors stored in the error bit register;
wherein the first threshold is a counted number of read-write errors per bit cell array address.

12. A computer implemented method for dynamic redundancy in a memory system, the memory system having a bit cell array and a non-volatile random access memory including a redundancy control module having a plurality of elements, each element of the redundancy control module having a master register, a substrate bit address register, an error bit address register and a redundancy bit register; the method comprising:
storing the bit cell array addresses of the one or more bits having the read-write errors in the error bit register;
determining whether the number of read-write errors of each of the bit cell array addresses having the read-write errors exceeds a first threshold; and in response to determining that the number of read-write errors is above the first threshold:
identifying the bit cell array address in the error bit register having the number of read-write errors above the first threshold as a suspect bit address;
sending a suspect bit signal to the control module identifying the suspect bit address;
determining whether the suspect bit address is already stored in an element of the redundancy control module; and
in response to determining that the suspect bit address is already stored in an element in the redundancy control module:
marking the element already storing the suspect bit address as bad;
replacing the address of the suspect bit with a new address of a redundant bit from the bit cell array; and
storing the suspect bit address in a unused element of the redundancy control module.

13. The method of claim 12, wherein storing the suspect bit address comprises storing the suspect bit address in the suspect bit register of the unused element of the redundancy control module and in response to the suspect bit address being stored, marking the master register of the element storing the suspect bit address as used.

14. The method of claim 13, wherein storing the new address of the redundant bit comprises storing the new address in a new address register of the element marked used.

15. The method of claim 13, wherein in response to determining that the suspect bit address is not previously stored in an element of the redundancy control module, storing the suspect bit address in an unused element of the redundancy control module and marking the master register of the element storing the suspect bit address as used.

16. The method of claim 12, wherein in response to determining that the number of read-write errors is greater than zero and not above the first threshold, determining whether the read-write error occurrences at the bit cell array address exceeds a second threshold, the second threshold being an address bit error rate, and in response to the read-write error occurrences at the bit cell array address exceeds the second threshold:
identifying the bit cell array address in the error bit register having the number of read-write errors above the second threshold as a suspect bit address;
sending a suspect bit signal to the redundancy control module identifying the suspect bit address;
determining whether the suspect bit address is already stored in an element of the redundancy control module; and
in response to determining that the suspect bit address is already stored in an element in the redundancy control module:
marking the element already storing the suspect bit address as bad;
replacing the address of the suspect bit with a new address of a redundant bit from the bit cell array; and
storing the suspect bit address in a unused element of the redundancy control module.

17. The method of claim 16, wherein storing the suspect bit address comprises storing the suspect bit address in a suspect bit register of the unused element of the redundancy control module and in response to the suspect bit address being stored, marking a master register of the element storing the suspect bit address as used.

18. The method of claim 17, wherein storing the new address of the redundant bit comprises storing the new address in a new address register of the element marked used.

19. The method of claim 16, wherein in response to determining that the suspect bit address is not previously stored in an element of the redundancy control module, storing the suspect bit address in an unused element of the redundancy control module and marking the master register of the element storing the suspect bit address as used.

20. A memory system comprising:
a bit cell array;
a plurality of redundancy control elements, each redundancy control element having a master register, a suspect bit address register, an error bit address register and a redundancy bit register;
an error correction code (ECC) module configured to perform during operation of the memory system:
storing the bit cell array addresses of the one or more bits having the read-write errors in the error bit register;
determining whether the number of read-write errors of each of the bit cell array address having the read-write errors exceeds a first threshold; and
in response to determining that the number of read-write errors is above the first threshold:
identifying the bit cell array address in the error bit register having the number of read-write errors above the first threshold as a suspect bit address; and
sending a suspect bit signal identifying the suspect bit address; and
redundancy control logic having a comparator providing a first input to a logic gate based on a comparison of an original bit cell address and a programmed bit cell address, the suspect bit signal providing a second input to the logic gate, wherein, the control logic is configured to perform:
in response to receiving the suspect bit signal, determining whether the suspect bit address is already stored in one of the redundancy control elements; and
in response to determining that the suspect bit address is already stored in one of the redundancy control elements:
marking the element already storing the suspect bit address as bad;
replacing the address of the suspect bit with a new address of a redundant bit from the bit cell array; and
storing the suspect bit address in an unused redundancy control element.

21. The memory system of claim 20, wherein the logic gate is a first AND gate, an output of the first AND gate being a first input to a first OR gate, and a signal to write the address of failing bit cells being a second input to the first OR gate.

22. The memory system of claim 21, wherein the signal to write the address of failing bit cells is correlated with the suspect bit signal to write a value of the master bit register and the suspect bit register to mark them as bad and/or used, respectively.

23. The memory system of claim 22, wherein the signal to write the address of failing bit cells is a second input to a second OR gate, an output of the first OR gate is input to the bad register and an output of second OR gate is input to the master register, the outputs of the bad register and the master register are input to a NOR gate, the Nor gate outputting a signal which is one input to second AND gate, an output of the NOR gate being a first input to a latch, a latch signal is a second input to the latch which latches an availability state of the element before writing inside it by the suspect bit signal.

24. The memory system of claim 23, wherein an element available signal is an inverse input to a third AND gate and an input to a fourth OR gate, an output of latch is an input to a third OR gate, an output of the second AND gate is input to a third AND gate, the suspect bit signal is an input to the third AND gate, and an output of third AND gate is feed back as an input to the second OR gate.

25. The memory system of claim 24, wherein an output of the latch is an inverse input to the first AND gate, the latch output for marking the element containing the address of a bit error rate above a threshold as bad and not the next unused available element.

* * * * *